United States Patent
Aikawa et al.

(10) Patent No.: US 12,027,385 B2
(45) Date of Patent: Jul. 2, 2024

(54) CERAMIC HEATER

(71) Applicant: NGK INSULATORS, LTD., Nagoya (JP)

(72) Inventors: Kenichiro Aikawa, Handa (JP); Yuji Akatsuka, Handa (JP); Hiroshi Takebayashi, Handa (JP); Takahiro Ando, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 288 days.

(21) Appl. No.: 17/222,164

(22) Filed: Apr. 5, 2021

(65) Prior Publication Data
US 2021/0225669 A1 Jul. 22, 2021

Related U.S. Application Data

(63) Continuation of application No. PCT/JP2020/034910, filed on Sep. 15, 2020.

(30) Foreign Application Priority Data

Sep. 18, 2019 (JP) ................. 2019-169349

(51) Int. Cl.
*H01L 21/67* (2006.01)
*H01L 21/683* (2006.01)
(Continued)

(52) U.S. Cl.
CPC .... *H01L 21/67103* (2013.01); *H01L 21/6833* (2013.01); *H05B 3/12* (2013.01); *H05B 3/265* (2013.01); *H05B 2203/016* (2013.01)

(58) Field of Classification Search
CPC ......... H01L 21/67098; H01L 21/67103; H01L 21/6831; H01L 21/6833; H05B 2203/016; H05B 3/12; H05B 3/265; H05B 3/283
See application file for complete search history.

(56) References Cited

U.S. PATENT DOCUMENTS

2002/0148823 A1* 10/2002 Watanabe ............... F23Q 7/001
219/270
2008/0016684 A1* 1/2008 Olechnowicz .......... C03C 3/062
29/748
(Continued)

FOREIGN PATENT DOCUMENTS

JP   H09-190873 A    7/1997
JP   2003-317907 A1   11/2003
(Continued)

OTHER PUBLICATIONS

English translation of International Preliminary Report on Patentability (Chapter I) (Application No. PCT/JP2020/034910) dated Mar. 31, 2022, 5 pages.
(Continued)

*Primary Examiner* — Sang Y Paik
(74) *Attorney, Agent, or Firm* — BURR PATENT LAW, PLLC

(57) ABSTRACT

The ceramic heater of the present invention includes: an alumina substrate having a wafer placement surface; resistance heating elements disposed in respective zones; multi-stage jumpers that supply electric power to the resistance heating elements, the resistance heating elements and the jumpers being embedded in the alumina substrate in this order from a wafer placement surface side; heating element connecting vias that vertically connect the resistance heating elements to the jumpers; and power supply vias exposed to the outside in order to supply electric power to the jumpers. The specific resistance of the heating element connecting vias is smaller than that of the resistance heating elements, and the absolute value of the difference between CTE of the heating element connecting vias and CTE of the alumina substrate is smaller than the absolute value of the difference
(Continued)

between CTE of the resistance heating elements and CTE of the alumina substrate.

8 Claims, 1 Drawing Sheet

(51) Int. Cl.
    *H05B 3/12*     (2006.01)
    *H05B 3/26*     (2006.01)

(56) References Cited

U.S. PATENT DOCUMENTS

| | | |
|---|---|---|
| 2009/0200289 A1* | 8/2009 | Unno ................ H01L 21/67103 |
| | | 219/468.1 |
| 2017/0110357 A1* | 4/2017 | Ishikawa ............. H01L 21/6833 |
| 2017/0117175 A1 | 4/2017 | Katsuda et al. |
| 2017/0280509 A1 | 9/2017 | Takebayashi |

FOREIGN PATENT DOCUMENTS

| | | |
|---|---|---|
| JP | 2004-253810 A1 | 9/2004 |
| JP | 2017-228360 A1 | 12/2017 |
| WO | 2016/042957 A1 | 3/2016 |
| WO | 2017/029876 A1 | 2/2017 |

OTHER PUBLICATIONS

International Search Report and Written Opinion (Application No. PCT/JP2020/034910) dated Nov. 2, 2020.

* cited by examiner

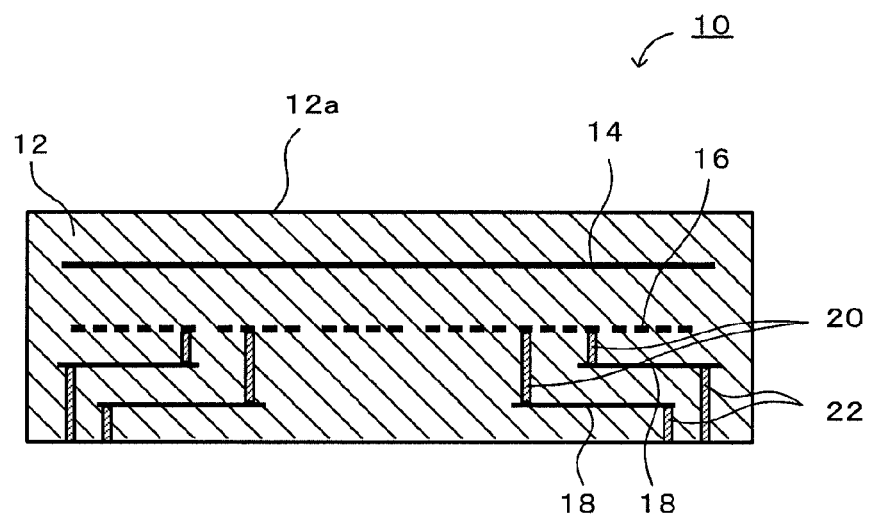

CERAMIC HEATER

BACKGROUND OF THE INVENTION

1. Field of the Invention

The present invention relates to a ceramic heater.

2. Description of the Related Art

An electrostatic chuck heater that holds a semiconductor wafer by suction has conventionally been used for semiconductor wafer processing. One known electrostatic chuck heater includes: an electrostatic chuck including a ceramic sintered body and an electrostatic electrode embedded therein; and a sheet heater that is a resin sheet including a plurality of resistance heating elements and having a surface resin-bonded to the electrostatic chuck, as shown in PTL 1. The sheet heater further includes: jumpers for supplying electric power to the plurality of resistance heating elements; heating element connecting vias for vertically connecting the resistance heating elements to the jumpers; and power supply vias exposed to the outside in order to supply electric power to the jumpers.

CITATION LIST

Patent Literature

PTL 1: WO 2017/029876 A1

SUMMARY OF THE INVENTION

In the above electrostatic chuck heater, the resin sheet cannot provide sufficient heat resistance and sufficient heat removal ability. There is therefore a demand for replacement of the resin sheet with a structure including a ceramic sintered body and an electrostatic electrode embedded therein. When the ceramic used is alumina, heat generated by vias during energization is large, and this causes problems such as deterioration in thermal uniformity of a wafer and breakage around the peripheries of the vias.

The present invention has been made to solve the foregoing problems, and it is a main object to improve thermal uniformity of a wafer and prevent breakage around the peripheries of vias when a ceramic heater including an alumina substrate including embedded resistance heating elements, jumpers, and the vias is used.

The ceramic heater of the present invention includes: an alumina substrate having an upper surface serving as a wafer placement surface; resistance heating elements disposed in respective zones; multistage jumpers that supply electric power to the resistance heating elements, the resistance heating elements and the jumpers being embedded in the alumina substrate in this order from a wafer placement surface side; heating element connecting vias that vertically connect the resistance heating elements to the jumpers; and power supply vias exposed to the outside in order to supply electric power to the jumpers. The specific resistance of the heating element connecting vias is smaller than the specific resistance of the resistance heating elements, and the absolute value of the difference between the coefficient of thermal expansion of the heating element connecting vias and the coefficient of thermal expansion of the alumina substrate is smaller than the absolute value of the difference between the coefficient of thermal expansion of the resistance heating elements and the coefficient of thermal expansion of the alumina substrate.

In this ceramic heater, the specific resistance of the heating element connecting vias is smaller than the specific resistance of the resistance heating elements. Therefore, although heat generated by the resistance heating elements during energization is large, heat generated by the heating element connecting vias during energization is small. The thermal uniformity of a wafer is thereby improved. Moreover, the absolute value of the difference between the coefficient of thermal expansion of the heating element connecting vias and the coefficient of thermal expansion of the alumina substrate is smaller than the absolute value of the difference between the coefficient of thermal expansion of the resistance heating elements and the coefficient of thermal expansion of the alumina substrate. Therefore, the occurrence of cracking due to the resistance heating elements having a small thickness can be prevented. Even when the cross-sectional area of each of the heating element connecting vias is increased in order to reduce heat generation during energization, the risk of breakage during production and use can be reduced.

In the ceramic heater of the present invention, it is preferable that the specific resistance of the heating element connecting vias is smaller than 0.75 times the specific resistance of the resistance heating elements. In this case, the thermal uniformity of the wafer is further improved.

In the ceramic heater of the present invention, it is preferable that the difference between the coefficient of thermal expansion of the resistance heating elements and the coefficient of thermal expansion of alumina is within ±4 ppm/K and that the difference between the coefficient of thermal expansion of the heating element connecting vias and the coefficient of thermal expansion of alumina is within ±0.6 ppm/K. The thickness of the resistance heating elements is small. Therefore, when the difference between the coefficient of thermal expansion of the resistance heating elements and the coefficient of thermal expansion of alumina serving as a base material is within ±4 ppm/K, the occurrence of cracking can be sufficiently prevented. Preferably, the heating element connecting vias each have a large cross-sectional area in order to reduce the amount of heat generated during energization. In this case, when the difference between the coefficient of thermal expansion of the heating element connecting vias and the coefficient of thermal expansion of alumina serving as the base material is small, i.e., within ±0.6 ppm/K, the risk of breakage during production and use can be sufficiently reduced.

In the ceramic heater of the present invention, it is preferable that the heating element connecting vias contain metallic ruthenium. The coefficient of thermal expansion of alumina is 7.9 ppm/K at 40 to 800° C., and the coefficient of thermal expansion of metallic ruthenium is 7.2 ppm/K at 40 to 800° C. Therefore, the difference in thermal expansion between the alumina substrate and the vias is very small. The use of the heating element connecting vias containing metallic ruthenium can prevent the occurrence of cracking due to the heating element connecting vias during production and use. The heating element connecting vias contain metallic ruthenium in an amount of preferably from 10% by weight to 95% by weight inclusive, more preferably from 20% by weight to 95% by weight inclusive, and still more preferably from 60% by weight to 95% by weight inclusive. The heating element connecting vias may contain a filler component in addition to metallic ruthenium. The filler component is preferably alumina and/or zirconia. Since alumina is the same material as the base material (the alumina substrate), the interfacial strength between the base material and the heating element connecting vias is improved. Since the coefficient of thermal expansion of zirconia is larger than that of alumina, the addition of a small amount of zirconia can adjust the coefficient of thermal expansion of the heating element connecting vias to be close to the coefficient of thermal expansion of the alumina substrate. When both alumina and zirconia are added as filler components, both the effects can be obtained.

The coefficient of thermal expansion at 40 to 800° C. is a value obtained by dividing the amount of expansion (unit: μm) per meter by a temperature difference of 760° C. (or K) in the range of 40° C. to 800° C. (the same applies to the following).

In the ceramic heater of the present invention, it is preferable that the amount of diffusion from the heating element connecting vias to the resistance heating elements is larger than the amount of diffusion from resistance heating elements to the heating element connecting vias. In this case, since the amount of diffusion from the resistance heating elements to the heating element connecting vias is small, an increase in the difference between the coefficient of thermal expansion of the heating element connecting vias and the coefficient of thermal expansion of alumina can be prevented. Therefore, the occurrence of cracking starting from the heating element connecting vias during production and use can be prevented, and the occurrence of cracking around the peripheries of the heating element connecting vias during production and use can be prevented. Moreover, the diffusion from the heating element connecting vias to the resistance heating elements allows the bonding therebetween to be maintained.

In the ceramic heater of the present invention, it is preferable that a main component of the resistance heating elements is tungsten carbide or metallic ruthenium and that a main component of the heating element connecting vias is metallic ruthenium. The term "main component" means a component whose volume ratio is 50% by volume of more or a component whose volume ratio is the highest among all the components.

In the ceramic heater of the present invention, the power supply vias and the jumpers may be formed of the same material as the material of the heating element connecting vias.

BRIEF DESCRIPTION OF THE DRAWINGS

FIG. 1 is a vertical cross-sectional view of an electrostatic chuck heater 10.

DETAILED DESCRIPTION OF THE INVENTION

A preferred embodiment of the present invention will be described with reference to the figure. In the present embodiment, an electrostatic chuck heater 10 is shown as an example of the ceramic heater of the present invention. FIG. 1 is a vertical cross-sectional view of the electrostatic chuck heater 10.

As shown in FIG. 1, the electrostatic chuck heater 10 includes an alumina substrate 12 having an upper surface serving as a wafer placement surface 12a. An electrostatic electrode (ESC electrode) 14, resistance heating elements 16 provided in respective zones, and multistage (two-stage in this case) jumpers 18 that supply electric power to the resistance heating elements 16 are embedded in the alumina substrate 12 in this order from the wafer placement surface 12a side. Heating element connecting vias 20 that vertically connect the resistance heating elements 16 to the jumpers 18 and power supply vias 22 exposed to the outside in order to supply electric power to the jumpers 18 are provided in the alumina substrate 12.

The specific resistance of the heating element connecting vias 20 is smaller than the specific resistance of the resistance heating elements 16. Preferably, the specific resistance of the heating element connecting vias 20 is equal to or smaller than 0.75 times the specific resistance of the resistance heating elements 16. The absolute value of the difference between the coefficient of thermal expansion of the heating element connecting vias 20 and the coefficient of thermal expansion of the alumina substrate 12 is smaller than the absolute value of the difference between the coefficient of thermal expansion of the resistance heating elements 16 and the coefficient of thermal expansion of the alumina substrate 12. Preferably, the difference between the coefficient of thermal expansion of the resistance heating elements 16 and the coefficient of thermal expansion of the alumina substrate 12 is within ±4 ppm/K. Preferably, the difference between the coefficient of thermal expansion of the heating element connecting vias 20 and the coefficient of thermal expansion of the alumina substrate 12 is within ±0.6 ppm/K.

Preferably, the main component of the resistance heating elements 16 is tungsten carbide. The resistance heating elements 16 may contain alumina as a filler component in addition to tungsten carbide. The coefficient of thermal expansion of tungsten carbide is 4.0 ppm/K at 40 to 800° C., and the coefficient of thermal expansion of alumina is 7.9 ppm/K at 40 to 800° C. Therefore, the difference between the coefficient of thermal expansion of tungsten carbide and the coefficient of thermal expansion of alumina is within ±4 ppm/K. The resistance heating elements 16 may contain, as the filler component, zirconia instead of alumina. The coefficient of thermal expansion of alumina is 7.9 ppm/K at 40 to 800° C., and the coefficient of thermal expansion of zirconia is 10.5 ppm/K at 40 to 800° C. Therefore, alumina and zirconia are useful as filler components used to increase the coefficient of thermal expansion of the resistance heating elements 16. By adjusting the content of the filler component in the resistance heating elements 16, the absolute value of the difference between the coefficient of thermal expansion of the heating element connecting vias 20 and the coefficient of thermal expansion of the alumina substrate 12 can be reduced to a value smaller than the absolute value of the difference between the coefficient of thermal expansion of the resistance heating elements 16 and the coefficient of thermal expansion of the alumina substrate 12, and the difference between the coefficient of thermal expansion of the resistance heating elements 16 and the coefficient of thermal expansion of the alumina substrate 12 can be adjusted within ±4 ppm/K.

Preferably, the main component of the heating element connecting vias 20 is metallic ruthenium. The coefficient of thermal expansion of metallic ruthenium is 7.2 ppm/K at 40 to 800° C., and the coefficient of thermal expansion of alumina is 7.9 ppm/K at 40 to 800° C. Therefore, the difference between the coefficient of thermal expansion of metallic ruthenium and the coefficient of thermal expansion of alumina is within ±0.6 ppm/K. The specific resistance of metallic ruthenium is $2 \times 10^{-5}$ Ωcm, and the specific resistance of tungsten carbide is $3 \times 10^{-5}$ Ωcm. The specific resistance of metallic ruthenium is equal to or smaller than 0.75 times the specific resistance of tungsten carbide. The amount of diffusion from metallic ruthenium to tungsten carbide is larger than the amount of diffusion from tungsten carbide to metallic ruthenium. The heating element connecting vias 20 may contain, in addition to metallic ruthenium, alumina and/or zirconia as a filler component. Alumina and zirconia are useful as filler components used to increase the coefficient of thermal expansion of heating element connecting vias 20. By adjusting the content of the filler component in the heating element connecting vias 20, the absolute value of the difference between the coefficient of thermal expansion of the heating element connecting vias 20 and the coefficient of thermal expansion of the alumina substrate 12 can be reduced to a value smaller than the absolute value of the difference between the coefficient of thermal expansion of the resistance heating elements 16 and the coefficient of thermal expansion of the alumina substrate 12, and the difference between the coefficient of thermal expansion of the heating element connecting vias 20 and the coefficient of thermal expansion of the alumina substrate 12 can be adjusted within ±0.6 ppm/K.

Preferably, the jumpers 18 and the power supply vias 22 are formed of the same material as the material of the heating element connecting vias 20.

In the electrostatic chuck heater 10 described above in detail, the specific resistance of the heating element connecting vias 20 is smaller than the specific resistance of the resistance heating elements 16. Therefore, although the amount of heat generated by the resistance heating elements 16 during energization is large, the amount of heat generated by the heating element connecting vias 20 during energization is small. The thermal uniformity of a wafer is thereby improved. The absolute value of the difference between the coefficient of thermal expansion of the heating element connecting vias 20 and the coefficient of thermal expansion of the alumina substrate 12 is smaller than the absolute value of the difference between the coefficient of thermal expansion of the resistance heating elements 16 and the coefficient of thermal expansion of the alumina substrate 12. Therefore, the occurrence of cracking due to the resistance heating elements 16 having a small thickness (e.g., 10 to 100 μm) can be prevented. Moreover, even when the cross-sectional area of each of the heating element connecting vias 20 is increased to reduce the amount of heat during energization, the risk of breakage during production and use can be reduced.

Preferably, the specific resistance of the heating element connecting vias 20 is smaller than 0.75 times the specific resistance of the resistance heating elements 16. In this case, the thermal uniformity of the wafer is further improved.

Preferably, the difference between the coefficient of thermal expansion of the resistance heating elements 16 and the coefficient of thermal expansion of the alumina substrate 12 is within ±4 ppm/K, and the difference between the coefficient of thermal expansion of the heating element connecting vias 20 and the coefficient of thermal expansion of the alumina substrate 12 is within ±0.6 ppm/K. The thickness of the resistance heating elements 16 is small (e.g., 10 to 100 μm). Therefore, when the difference between the coefficient of thermal expansion of the resistance heating elements 16 and the coefficient of thermal expansion of alumina used as the base material is within ±4 ppm/K, the occurrence of cracking can be sufficiently prevented. Preferably, the heating element connecting vias 20 each have a large cross-sectional area in order to reduce the amount of heat generated during energization. In this case, when the difference between the coefficient of thermal expansion of the heating element connecting vias 20 and the coefficient of thermal expansion of alumina used as the base material is small, i.e., within ±0.6 ppm/K, the risk of breakage during production and use can be sufficiently reduced.

Moreover, the amount of diffusion from the heating element connecting vias 20 (its main component is metallic ruthenium) to the resistance heating elements 16 (its main component is tungsten carbide) is larger than the amount of diffusion from the resistance heating elements 16 to the heating element connecting vias 20. Specifically, the amount of diffusion from the resistance heating elements 16 to the heating element connecting vias 20 is small. This can prevent an increase in the difference between the coefficient of thermal expansion of the heating element connecting vias 20 and the coefficient of thermal expansion of alumina. Therefore, the occurrence of cracking starting from the heating element connecting vias 20 during production and use can be prevented, and the occurrence of cracking around the peripheries of the heating element connecting vias 20 during production and use can be prevented. Moreover, the diffusion from the heating element connecting vias 20 to the resistance heating elements 16 allows the bonding therebetween to be maintained.

The present invention is not limited the embodiment described above. It will be appreciated that the present invention can be implemented in various forms so long as they fall within the technical scope of the invention.

It has been described in the above embodiment that, for example, the main component of the heating element connecting vias 20 is preferably metallic ruthenium, but this is not a limitation. For example, the heating element connecting vias 20 may contain metallic ruthenium. In this case, the heating element connecting vias 20 contains metallic ruthenium in an amount of preferably from 10% by weight to 95% by weight inclusive, more preferably from 20% by weight to 95% by weight inclusive, and still more preferably from 60% by weight to 95% by weight inclusive. The heating element connecting vias 20 may contain a filler component other than metallic ruthenium. The filler component is preferably alumina and/or zirconia.

In the above embodiment, the resistance heating elements 16 may contain metallic ruthenium or may contain metallic ruthenium as the main component. The resistance heating elements 16 may contain a filler component in addition to metallic ruthenium. The filler component is preferably alumina and/or zirconia.

EXAMPLES

In each of Experimental Examples 1 to 7, the electrostatic chuck heater 10 in FIG. 1 was produced. In the electrostatic chuck heater 10, the electrostatic electrode 14 having a diameter of 290 mm and a thickness of 0.1 mm, the inner and outer resistance heating elements 16, the ribbon-shaped jumpers 18 having a width of 5 mm, and the vias 20 and 22 having a diameter of 1.2 mm and a thickness of 0.6 mm are embedded in the alumina substrate 12 having a diameter of 300 mm and a thickness of 4 mm. The inner resistance heating element 16 is disposed concentric with the alumina substrate 12 in a unicursal manner in a circular region with a diameter of 200 mm, and the outer resistance heating elements 16 is disposed in a unicursal manner in an annular region outside the circular region. The material of the electrostatic electrode 14 is tungsten carbide, and the material of the resistance heating elements 16 is tungsten carbide. The material of the jumpers 18 is metallic ruthenium. The material of the filler component used for the vias 20 and 22 is alumina, zirconia, or both of them. Tn Experimental Examples 1 to 7, the electrostatic chuck heaters 10 were produced under the same conditions except that materials shown in Table 1 were used as the materials of the heating element connecting vias 20 and the power supply vias 22.

Table 1 shows the following values in each of Experimental Examples 1 to 7: the CTE of the vias 20 and 22 at 40 to 800° C., the difference (first CTE difference) between the CTE of the vias 20 and 22 at 40 to 800° C. and the CTE of the alumina substrate 12 at 40 to 800° C., the difference (second CTE difference) between the CTE of the resistance heating elements 16 at 40 to 800° C. and the CTE of the alumina substrate 12 at 40 to 800° C., and the ratio (the specific resistance ratio) of the specific resistance of the vias 20 and 22 to the specific resistance of the resistance heating elements 16. The specific resistance of the vias 20 and 22 in each of Experimental Examples 4 and 5 is also shown in Table 1.

One of the electrostatic chuck heaters 10 in Experimental Example 1 to 7 was placed in a vacuum chamber, and the temperature distribution on the wafer placement surface 12a when the temperature of a predetermined reference point reached 60° C. was measured from the outside of the chamber using an infrared radiation camera (IR camera). Then the difference between the temperature of the reference point and the temperature of a portion of the wafer placement surface 12a directly above each of the vias 20 and 22 was determined (the difference=Heat generation in Table 1 [° C.]). Moreover, the presence or absence of cracking in the alumina substrate 12 was checked. Specifically, by observing a polished cross section under an SEM (scanning electron microscope), the presence of cracking was checked. The results are shown in Table 1.

TABLE 1

| Example | Material of vias | | | Specific resistance [Ω · cm] | Ratio of the specific resistance*1 | CTE of the vias [ppm/K] | First CTE difference [ppm/K]*2 | Second CTE difference [ppm/K]*3 | Cracking | Heat generation [° C.] |
|---|---|---|---|---|---|---|---|---|---|---|
| | Metallic Ru [wt %] | Alumina filler [wt %] | Zirconia filler [wt %] | | | | | | | |
| 1 | 10 | 80 | 0 | — | <1 | 7.8 | 0.1 | 3.9 | No | 2.0 |
| 2 | 20 | 80 | 0 | — | <1 | 7.8 | 0.1 | 3.9 | No | 1.8 |
| 3 | 40 | 60 | 0 | — | <1 | 7.6 | 0.3 | 3.9 | No | 1.4 |
| 4 | 60 | 40 | 0 | 2.20E−05 | 0.73 | 7.5 | 0.4 | 3.9 | No | 1.0 |
| 5 | 80 | 20 | 0 | 2.10E−05 | 0.70 | 7.3 | 0.6 | 3.9 | No | 0.6 |
| 6 | 80 | 10 | 10 | — | <1 | 7.6 | 0.3 | 3.9 | No | 0.6 |
| 7 | 95 | 0 | 5 | — | <1 | 7.4 | 0.5 | 3.9 | No | 0.3 |

*1Ratio of the specific resistance means that the ratio of the specific resistance of the vias to the specific resistance of the resistance heating elements.
*2First CTE difference means that the difference between CTE of the specific resistance of the vias at 40 to 800° C. and CTE of the alumina substrate at 40 to 800° C.
*3Second CTE difference means that the difference between CTE of the resistance heating element at 40 to 800° C. and CTE of the alumina substrate at 40 to 800° C.

As can be seen from Table 1, in Experimental Examples 1 to 7, the heat generation in the portions directly above the vias 20 and 22 was as small as 2.0 [° C.] or less, and no cracking occurred. In particular, in Experimental Examples 2 to 7, the heat generation in the portions directly above the vias 20 and 22 was as small as 1.8 [° C.] or less. In Experimental Examples 4 to 7, the heat generation in the portions directly above the vias 20 and 22 was as small as 1.0 [° C.] or less. Experimental Examples 1 to 7 correspond to the Examples of the present invention. However, the present invention is not limited to these Examples.

The present application claims priority from JP Patent Application No. 2019-169349 filed Sep. 18, 2019, the entire contents of which are incorporated herein by reference.

What is claimed is:

1. A ceramic heater comprising: an alumina substrate having an upper surface serving as a wafer placement surface; resistance heating elements disposed in respective zones; multistage jumpers that supply electric power to the resistance heating elements, the resistance heating elements and the jumpers being embedded in the alumina substrate in this order from a wafer placement surface side; heating element connecting vias that vertically connect the resistance heating elements to the jumpers; and power supply vias exposed to an outside in order to supply electric power to the jumpers,
   wherein a specific resistance of the heating element connecting vias is smaller than a specific resistance of the resistance heating elements,
   wherein an absolute value of a difference between a coefficient of thermal expansion of the heating element connecting vias and a coefficient of thermal expansion of the alumina substrate is smaller than an absolute value of a difference between a coefficient of thermal expansion of the resistance heating elements and the coefficient of thermal expansion of the alumina substrate, and
   wherein the heating element connecting vias comprise from 10 wt. % to 40 wt. % metallic ruthenium, from 60 wt. % to 90 wt. % alumina filler, and from 0 wt. % to 10 wt. % zirconia filler with the combination of alumina filler and zirconia filler comprising from 60 wt. % to 90 wt. % of the heating element connecting vias.

2. The ceramic heater according to claim 1, wherein the specific resistance of the heating element connecting vias is smaller than 0.75 times the specific resistance of the resistance heating elements.

3. The ceramic heater according to claim 1, wherein the difference between the coefficient of thermal expansion of the resistance heating elements and the coefficient of thermal expansion of the alumina substrate is within ±4 ppm/K, and
   wherein the difference between the coefficient of thermal expansion of the heating element connecting vias and the coefficient of thermal expansion of the alumina substrate is within ±0.6 ppm/K.

4. The ceramic heater according to claim 1, wherein the heating element connecting vias contain metallic ruthenium in an amount of from 20% by weight to 40% by weight.

5. The ceramic heater according to claim 1, wherein the amount of diffusion from the heating element connecting vias to the resistance heating elements is larger than the amount of diffusion from the resistance heating elements to the heating element connecting vias.

6. The ceramic heater according to claim 4, wherein a main component of the resistance heating elements is tungsten carbide or metallic ruthenium.

7. The ceramic heater according to claim 1, wherein the power supply vias and the jumpers are made of the same material as the material of the heating element connecting vias.

8. The ceramic heater according to claim 1, wherein the heating element connecting vias are essentially free of zirconia filler.

\* \* \* \* \*